(12) United States Patent
Muraki et al.

(10) Patent No.: US 9,362,149 B2
(45) Date of Patent: Jun. 7, 2016

(54) ETCHING METHOD, ETCHING APPARATUS, AND STORAGE MEDIUM

(71) Applicant: TOKYO ELECTRON LIMITED, Tokyo (JP)

(72) Inventors: Yusuke Muraki, Nirasaki (JP); Shigeru Kasai, Nirasaki (JP); Tomohiro Suzuki, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 14/479,466

(22) Filed: Sep. 8, 2014

(65) Prior Publication Data
US 2015/0072533 A1 Mar. 12, 2015

(30) Foreign Application Priority Data

Sep. 12, 2013 (JP) ................................. 2013-189224

(51) Int. Cl.
*H01L 21/67* (2006.01)
*H01L 21/311* (2006.01)
*H01L 21/768* (2006.01)

(52) U.S. Cl.
CPC .... *H01L 21/67069* (2013.01); *H01L 21/31116* (2013.01); *H01L 21/67115* (2013.01); *H01L 21/67207* (2013.01); *H01L 21/76802* (2013.01); *H01L 21/76897* (2013.01)

(58) Field of Classification Search
CPC ................... H01L 21/67069; H01L 21/31116; H01L 21/67115
See application file for complete search history.

(56) References Cited

U.S. PATENT DOCUMENTS

| 5,755,886 A | * | 5/1998 | Wang | .................... | C23C 16/402 |
| | | | | | 118/715 |
| 6,372,657 B1 | * | 4/2002 | Hineman | .......... | H01L 21/02046 |
| | | | | | 134/1.2 |

FOREIGN PATENT DOCUMENTS

JP 2007180418 A 7/2007

* cited by examiner

*Primary Examiner* — Nadine Norton
*Assistant Examiner* — Mahmoud Dahimene
(74) *Attorney, Agent, or Firm* — Nath, Goldberg & Meyer; Jerald L. Meyer

(57) ABSTRACT

Provided is a method of etching a silicon oxide film, which includes supplying a mixture gas of a halogen element-containing gas and a basicity gas onto a surface of the silicon oxide film; modifying the silicon oxide film to produce a reaction product; and heating the reaction product to remove the reaction product. Modifying the silicon oxide film and heating the reaction product are performed using one chamber. In heating the reaction product, the reaction product is selectively heated by a heating unit.

9 Claims, 8 Drawing Sheets

ETCHING METHOD, ETCHING APPARATUS, AND STORAGE MEDIUM

CROSS-REFERENCE TO RELATED APPLICATION

This application claims the benefit of Japanese Patent Application No. 2013-189224, filed on Sep. 12, 2013, in the Japan Patent Office, the disclosure of which is incorporated herein in its entirety by reference.

TECHNICAL FIELD

The present disclosure relates to an etching method and apparatus for dry-etching a silicon oxide film, and a non-transitory computer-readable storage medium therefor.

BACKGROUND

In a process of manufacturing semiconductor devices, a method of dry-etching a silicon oxide film formed on a surface of a semiconductor wafer (hereinafter, simply referred to as a "wafer") without using plasma, has been known. Such a dry-etching method includes modifying the silicon oxide film to produce a reaction product, and heating the reaction product to vaporize (or sublimate) the reaction product. The dry-etching method etches the silicon oxide film by sequentially performing the modification process and the heating process.

Specifically, the interior of a modification chamber where a wafer is received is first controlled to have a low pressure close to a vacuum state. Subsequently, for example, a mixture gas of a hydrogen fluoride gas (HF gas) and an ammonia gas ($NH_3$ gas) is supplied into the chamber while adjusting the wafer to have a predetermined temperature, so that a silicon oxide film is modified into a reaction product. Thereafter, the wafer is transferred from the modification chamber to a heating chamber where the reaction product formed on the silicon oxide film is heated and sublimated. By doing this, the silicon oxide film is etched.

Once the silicon oxide film is modified (i.e., the generation of the reaction product) to a certain degree of depth starting at a surface of the silicon oxide film, a saturation point is deemed to have reached and the silicon oxide film is not modified any further. That is, there is a limit to an etching rate of the silicon oxide film which is to be etched by one cycle of the modification process and the heating process. Thus, in order to obtain a desired etching rate of the silicon oxide film, a sequence of the modification process and the heating process need to be performed for a plurality of times.

This also requires repeatedly transferring the wafer between the modification chamber and the heating chamber, thus reducing throughput due to the time spent in transferring the wafer.

In order to reduce the number of repetitions of the modification process and the heating process, there is a method of adjusting a heating temperature depending on the type of a silicon oxide film or adjusting a partial pressure of the hydrogen fluoride (HF) gas to be introduced into the modification chamber during the modification process.

However, such a method performs the modification process and the heating process using respective chambers, resulting in reduced throughput due to the time spent in transferring the wafer between the respective chambers.

In addition, if the sequence of the modification process and the heating process is performed using the same chamber, it takes a long time to adjust a temperature of the wafer due to a difference in processing temperature between the modification process and the heating process. This prolongs an overall time required for etching the silicon oxide film. In particular, the wafer which has undergone the heating process, has a high temperature (about 200 degrees C.). As such, when performing the modification process again after the heating process, it takes a long time to cool the highly heated wafer. This prolongs the time required for performing a subsequent modification process on the silicon oxide film, thus resulting in reduced throughput.

SUMMARY

Some embodiments of the present disclosure provide an etching method and an etching apparatus which are capable of enhancing throughput in etching a silicon oxide film using a single chamber in which both a modification and a heating process are performed, and a computer-readable storage medium.

According to one embodiment of the present disclosure, provided is a method of etching a silicon oxide film, which includes: supplying a mixture gas of a halogen element-containing gas and a basicity gas onto a surface of the silicon oxide film; modifying the silicon oxide film to produce a reaction product; and heating the reaction product to remove the reaction product, wherein modifying the silicon oxide film and heating the reaction product are performed using one chamber, and wherein in heating the reaction product, the reaction product is selectively heated by a heating unit.

According to another embodiment of the present disclosure, provided is an apparatus of etching a silicon oxide film, which includes: a chamber configured to be depressurized; a mounting table provided inside the chamber and configured to mount a substrate on the mounting table; a mixture gas supply path through which a mixture gas of a halogen element-containing gas and a basicity gas is supplied into the chamber; and a heating unit configured to selectively heat a reaction product which is produced by modifying the silicon oxide film inside the chamber.

According to another embodiment of the present disclosure, provided is a non-transitory computer-readable storage medium storing a program operating on a control computer of a processing system, wherein the program, when executed by the control computer, causes the processing system to perform the aforementioned method.

BRIEF DESCRIPTION OF THE DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Reference will now be made in detail to various embodiments, examples of which are shown in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Figure 1:
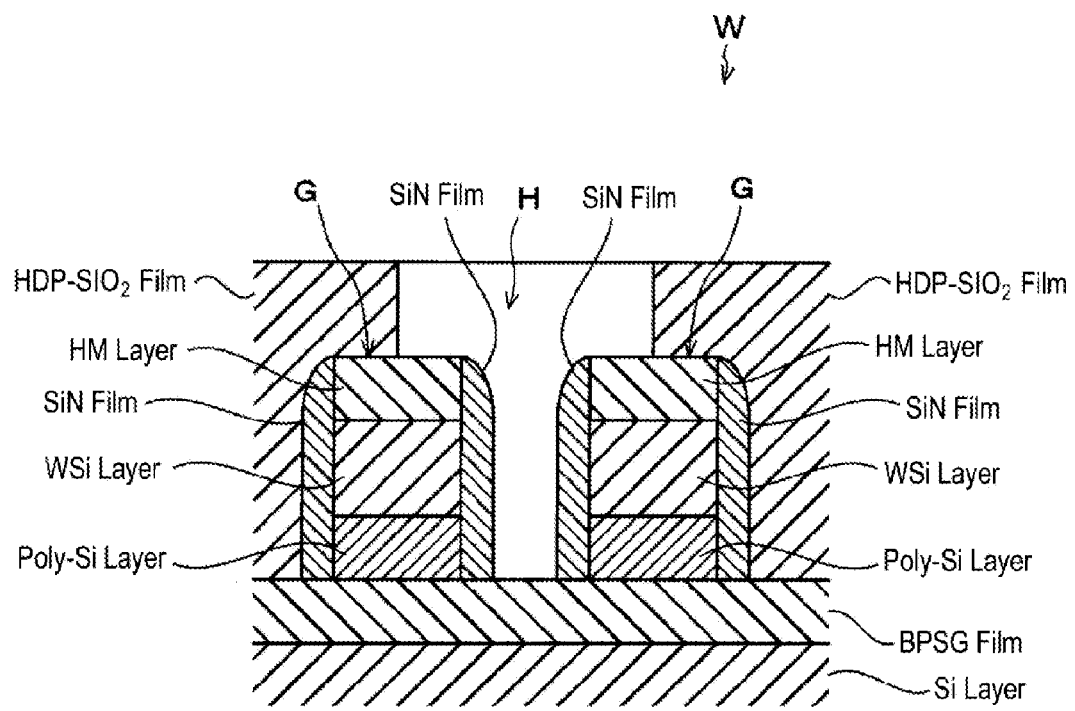
FIG. 1 is a schematic vertical sectional view showing a structure of a surface of a wafer before a boron-doped phosphorus silicate glass (BPSG) film is etched.

First, a structure of a semiconductor wafer used as an example of a substrate, which is processed by an etching method according to the present embodiment, will be described. FIG. 1 is a schematic sectional view of a wafer W in the course of forming a dynamic random access memory (DRAM) as a semiconductor device, which shows a portion of a surface (a device formation surface) of the wafer W. The wafer W is, for example, a silicon wafer formed in a substantially disk-shaped thin plate. A boron-doped phosphorus silicate glass (BPSG) film as an insulating film is formed on a surface of a silicon (Si) layer. The BPSG film is a silicon oxide film (silicon dioxide ($SiO_2$) containing boron (B) and phosphorus (P). The BPSG film is a chemical vapor deposition (CVD)-based silicon oxide film which is formed on the surface of the wafer W using a thermal CVD method in a CVD apparatus or the like.

Two gate portions G are arranged on an upper surface of the BPSG film. Each of the gate portions G includes a gate electrode, a hard mask (HM) layer, and a side wall. Each of the gate electrodes is, for example, a polycrystalline silicon (Poly-Si) layer and is arranged on the upper surface of the BPSG film. For example, tungsten silicide (WSi) layers are formed on upper surfaces of the Poly-Si layers, respectively. Each of the HM layers is formed of, e.g., an insulator such as a silicon nitride (SiN), and is formed on an upper surface of each of the WSi layers. The side walls are, for example, insulators such as SiN films, and are formed to cover respective lateral surfaces of the Poly-Si layer, the WSi layer and the HM layer in each of the gate portions G. Lower end portions of the SiN films are formed up to positions at which they are brought into contact with the upper surface of the BPSG film.

Further, for example, a high density plasma-silicon oxide (HDP-$SiO_2$) film is formed on the BPSG film while covering a portion of each of the two gate portions G. The HDP-$SiO_2$ film is a CVD-based silicon oxide film (plasma CVD oxide film) which is formed using a bias high density plasma (HDP) CVD method. The HDP-$SiO_2$ film is used as an interlayer insulating film. Also, both the HDP-$SiO_2$ film and the BPSG film are CVD-based oxide films. The HDP-$SiO_2$ film has a high density and a solid property compared with the BPSG film. In FIG. 1, no film has yet been formed on a surface of the HDP-$SiO_2$ film, thereby leaving the HDP-$SiO_2$ film exposed.

A contact hole H is formed between the two gate portions G (between the SiN films formed in each of the gate portions G) in the HDP-$SiO_2$ film. The contact hole H is formed to extend from the surface of the HDP-$SiO_2$ film to the upper surface of the BPSG film. In the contact hole H, a portion of an upper surface of the HM layer in each of the gate portions G and the SiN films formed to face each other inwards between the gate portions G are exposed. In addition, the upper surface of the BPSG film is exposed at a lower portion of the contact hole H. The contact hole H is formed by selectively etching (anisotropic etching) the HDP-$SiO_2$ film with respect to the SiN films and the HM layers in the gate portions G by, e.g., a plasma etching.

Figure 2:
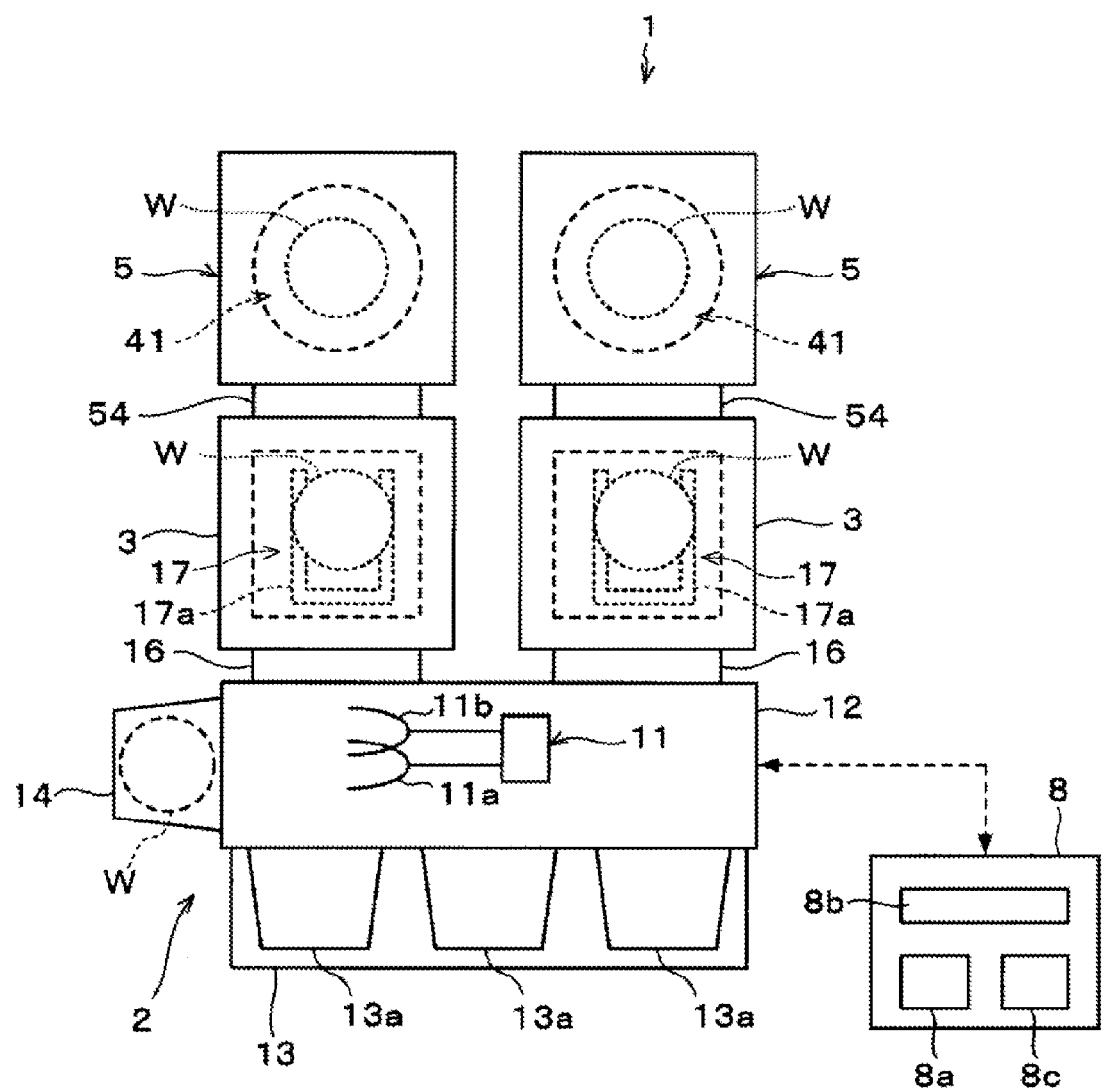
FIG. 2 is a schematic plane view of a processing system.

Next, a processing system which performs an etching process on the BPSG film exposed at the lower portion of the contact hole H in the wafer W will be described. As shown in FIG. 2, a processing system 1 includes a loading/unloading unit 2 configured to load and unload the wafer W into and from the processing system 1, two load lock chambers 3 installed adjacent to the loading/unloading unit 2, two etching apparatuses 5 respectively installed adjacent to the load lock chambers 3, and a control computer 8 configured to send control commands to respective parts of the processing system 1. Each of the etching apparatuses 5 performs a chemical oxide removal (COR) process as a modification process and a post heat treatment (PHT) process as a heating process.

The COR process is a process that modifies a silicon oxide film residing on a surface of a substrate (as the wafer W) to produce a reaction product. Specifically, the COR process supplies a processing gas (a halogen element-containing gas and a basicity gas) to the substrate such that a chemical reaction occurs between the silicon oxide film formed on the substrate and the processing gas, thereby producing the reaction product. Examples of the halogen element-containing gas may include at least one selected from a group consisting of an HF gas, an $F_2$ gas, an $NF_3$ gas, a $CH_3F$ gas, an $SF_6$ gas and a $ClF_3$ gas. Examples of the basicity gas may include an $NH_3$ gas. In this case, the reaction product mainly containing an ammonium fluorosilicate ($(NH_4)_2SiF_6$), moisture ($H_2O$) is produced. The PHT process is a process that heats the substrate which has undergone the COR process and vaporizes (or sublimates) the reaction product such as the ammonium fluorosilicate.

The loading/unloading unit 2 includes a transfer chamber 12 in which a first wafer transfer mechanism 11 configured to transfer the wafer W of, e.g., a substantially disk shape, is provided. The first wafer transfer mechanism 11 has two transfer arms 11a and 11b configured to substantially horizontally hold the wafer W. In one side of the transfer chamber 12 is installed a mounting table 13 on which a plurality (e.g., three) of carriers 13a are mounted. Each of the carriers 13a is capable of receiving a plurality of wafers W therein. Further, an orienter 14 is installed in another side of the transfer chamber 12, and is configured to rotate the wafers W, optically obtain eccentric amounts thereof, and align the wafers W based on the obtained eccentric amounts.

In the loading/unloading unit 2, with an operation of the first wafer transfer mechanism 11, the wafer W is rotated, substantially horizontally moved in a linear direction, or vertically moved while being held by the transfer arms 11a and 11b. In this way, the wafer W is transferred to a desired position. Further, the transfer arms 11a and 11b move between the carriers 13a mounted on the mounting table 13, the orienter 14 and the load lock chambers 3 such that the wafer W is loaded and unloaded into and from the respective part.

Each of the load lock chambers 3 is coupled to the transfer chamber 12 through a respective gate valve 16. Each of the load lock chambers 3 includes a second wafer transfer mechanism 17 which is configured to transfer the wafer W. Each of the second wafer transfer mechanisms 17 includes a transfer arm 17a configured to substantially horizontally hold the wafer W. The load lock chambers 3 are configured to be vacuum-drawn.

In each of the load lock chambers 3, with an operation of the second wafer transfer mechanism 17, the wafer W is rotated, substantially horizontally moved in a linear direction, or vertically moved while being held by the transfer arm 17a. Further, the transfer arm 17a advances into and retracts from each of the etching apparatuses 5 which are cascaded to the respective load lock chambers 3. Thus, the wafer W is loaded and unloaded into and from each of the etching apparatuses 5.

Figure 3:
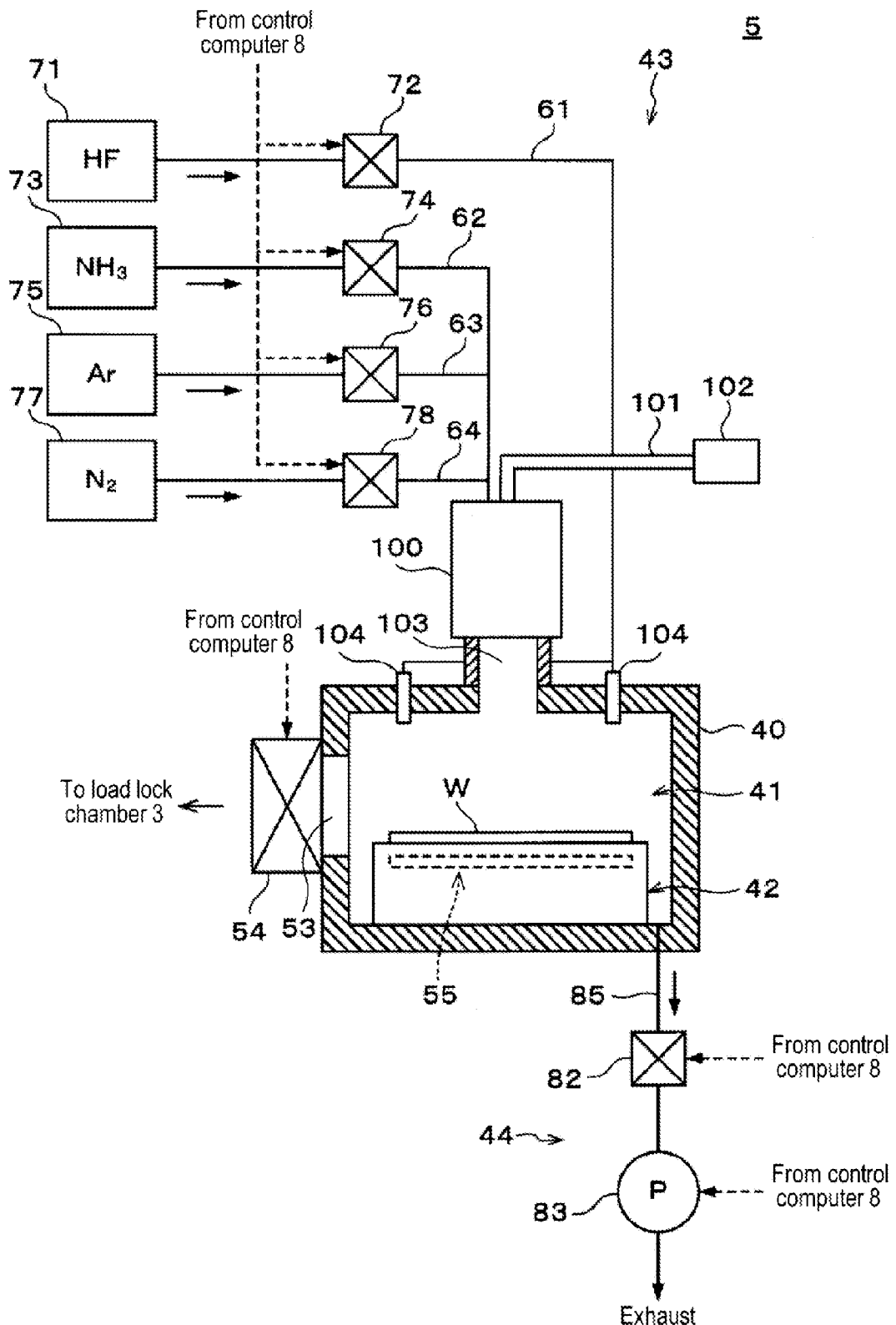
FIG. 3 is a schematic view showing a configuration of an etching apparatus.

As shown in FIG. 3, the etching apparatus 5 includes an airtight chamber 40. The interior of the chamber 40 is defined as a processing chamber (processing space) 41 in which the wafer W is received. A mounting table 42 on which the wafer W is substantially horizontally mounted is installed inside the chamber 40. Further, the etching apparatus 5 includes a gas supply mechanism 43 configured to supply gas into the processing chamber 41, and an exhaust mechanism 44 configured to exhaust gas within the processing chamber 41.

An inlet/outlet 53 through which the wafer W is loaded into and unloaded from the processing chamber 41 is formed in a side wall of the chamber 40. A gate valve 54 is installed to open and close the inlet/outlet 53. The processing chamber 41 is coupled to the load lock chamber 3 through the inlet/outlet 53 and the gate valve 54.

A remote plasma generating device 100 which is configured to generate plasma by converting gas supplied thereto is installed above the chamber 40. The remote plasma generating device 100 is coupled to a waveguide 101 through which microwaves are propagated. The waveguide 101 is connected to a microwave generating device 102 that generates the microwaves. A plasma introduction passage 103 is formed between the remote plasma generating device 100 and the chamber 40. Also, a method of generating the microwaves is not particularly limited, and any suitable methods including a magnetron, an exciter, or the like may be used.

The mounting table 42, which has a substantially circular shape when viewed from the plane, is fixed to a lower portion of the chamber 40. A temperature controller 55 is installed inside the mounting table 42 to adjust a temperature of the mounting table 42. The temperature controller 55 includes a passageway through which a temperature control liquid (e.g., water or the like) circulates. A temperature of an upper surface of the mounting table 42 is controlled by heat exchange with the liquid flowing through the passageway. Further, a temperature of the wafer W mounted on the mounting table 42 is controlled by heat exchange with the mounting table 42. In some embodiments, an electric heater which heats the mounting table 42 and the wafer W using resistance heat, may be used as the temperature controller 55.

The gas supply mechanism 43 includes a hydrogen fluoride (HF) gas supply path 61 through which an HF gas is supplied, an ammonia ($NH_3$) gas supply path 62 through which an $NH_3$ gas is supplied, an argon (Ar) gas supply path 63 through which an Ar gas used as an inert gas is supplied, and a nitrogen ($N_2$) gas supply path 64 through which an $N_2$ gas used as the inert gas is supplied. The HF gas supply path 61 is connected to a gas supply nozzle 104 which is installed to penetrate through the ceiling of the chamber 40. The HF gas is introduced into the processing chamber 41 through the gas supply nozzle 104. The $NH_3$ gas supply path 62, the Ar gas supply path 63, and the $N_2$ gas supply path 64 are connected to the remote plasma generating device 100.

A flow rate adjusting valve 72, which is configured to adjust opening and closing operations of the HF gas supply path 61 and a supply flow rate of the HF gas, is installed in the HF gas supply path 61. The HF gas supply path 61 is coupled to a HF gas supply source 71 through the flow rate adjusting valve 72. A flow rate adjusting valve 74, which is configured to adjust opening and closing operations of the $NH_3$ gas supply path 62 and a supply flow rate of the $NH_3$ gas, is installed in the $NH_3$ gas supply path 62. The $NH_3$ gas supply path 62 is connected to an $NH_3$ gas supply source 73 through the flow rate adjusting valve 74. A flow rate adjusting valve 76, which is configured to adjust opening and closing operations of the Ar gas supply path 63 and a flow rate of the Ar gas, is installed in the Ar gas supply path 63. The Ar gas supply path 63 is connected to an Ar gas supply source 75 through the flow rate adjusting valve 76. A flow rate adjusting valve 78, which is configured to adjust opening and closing operations of the $N_2$ gas supply path 64 and a supply flow rate of the $N_2$ gas, is installed in the $N_2$ gas supply path 64. The $N_2$ gas supply path 64 is connected to an $N_2$ gas supply source 77 through the flow rate adjusting valve 78.

The exhaust mechanism 44 includes an on-off valve 82 and an exhaust pump 83. The exhaust pump 83 forcibly exhausts gas within the processing chamber 41 through an exhaust path 85. One end of the exhaust path 85 is connected to the lower portion of the chamber 40.

Further, operations of respective parts such as the gate valve 54, the temperature controller 55, the flow rate adjusting valves 72, 74, 76 and 78, the on-off valve 82, and the exhaust pump 83 in the etching apparatus 5 are controlled by control commands applied from the control computer 8. That is, the supply operation of the HF gas, the $NH_3$ gas, the Ar gas and the $N_2$ gas in the gas supply mechanism 43, the exhaust operation of the exhaust mechanism 44, the temperature control operation of the temperature controller 55 and the like are controlled by the control computer 8.

Functional components of the processing system 1 are connected to the control computer 8 that automatically controls an overall operation of the processing system 1 through respective signal lines. Here, the functional components refer to every part configured to operate to fulfill certain process conditions, such as the first wafer transfer mechanism 11, the second wafer transfer mechanisms 17, and the gate valve 54, the temperature controller 55, the flow rate adjusting valves 72, 74, 76 and 78, the on-off valve 82, the exhaust pump 83, and the microwave generating device 102 of the etching apparatus 5. The control computer 8 is typically a general-purpose computer which is capable of realizing a certain function according to an executed software.

As shown in FIG. 2, the control computer 8 includes a calculation unit 8a having a central processing unit (CPU), an input/output unit 8b connected to the calculation unit 8a, and a storage medium 8c to store control software, which is detachably installed to the input/output unit 8b. The storage medium 8c stores the control software (program) that cause the processing system 1 to perform a predetermined wafer processing method (which will be described later) when executed by the control computer 8. By executing the control software, the control computer 8 controls the respective functional components of the processing system 1 to fulfill various process conditions (e.g., an internal pressure of the processing chamber 41, etc.) set by a predetermined process recipe. That is, the control computer 8 provides a control command that causes an etching method for performing a sequence of the COR and PHT processes using the etching apparatus 5, which will be described in detail later.

In some embodiments, the storage medium 8c may be fixedly mounted in the control computer 8. In an alternative embodiment, the storage medium 8c may be detachably mounted to a reading device (not shown) installed in the control computer 8 so as to be read by the reading device. As an example, the storage medium 8c may include a hard disk drive with control software installed by a service man at a manufacturer of the processing system 1. As another example, the storage medium 8c may include a removable disk such as a CD-ROM or a DVD-ROM for control software to be stored. Such a removable disk is read by an optical reading device (not shown) installed in the control computer 8. As still another example, the storage medium 8c may include a random access memory (RAM) or a read only memory (ROM) for control software to be stored. As still another example, the storage medium 8c may include a cassette type ROM for control software to be stored. To sum up, any medium known in the field of computer technology may be used as the storage medium 8c. In addition, in a factory where a plurality of processing systems 1 is provided, the control software may be stored in a management computer for collectively controlling the control computer 8 of each of the processing systems 1. In this case, each of the processing systems 1 is operated by the management computer through a communication line to execute a certain process.

Next, the etching method of the wafer W, which is performed in the processing system 1 configured as above, will be described.

First, the wafer W having the contact hole H formed in the HDP-SiO$_2$ film as shown in FIG. 1, is received in any one of the carriers 13a, and subsequently, is transferred to the processing system 1. In the processing system 1, as shown in FIG. 2, the carrier 13a receives the plurality of wafers W, and is mounted on the mounting table 13. Subsequently, one target wafer W within the carrier 13a is taken out by the first wafer transfer mechanism 11, and then loaded into the load lock chamber 3. Thereafter, the load lock chamber 3 is closed and depressurized. Thereafter, the gate valve 54 is opened, and the wafer W is taken out the load lock chamber 3 by the second wafer transfer mechanism 17, and then loaded into the processing chamber 41 through the inlet/outlet 53 of the etching apparatus 5.

In the processing chamber 41, the wafer W is mounted on the mounting table 42 by the transfer arm 17a of the second wafer transfer mechanism 17, in a state where the device formation surface of the wafer W is oriented upward. Then, the transfer arm 17a is retracted from the processing chamber 41 and the inlet/outlet 53 is shut such that the processing chamber 41 is closed. Subsequently, the COR process starts.

Upon the closing of the processing chamber 41, the NH$_3$ gas, the Ar gas and the N$_2$ gas are supplied to the remote plasma generating device 100 through the NH$_3$ gas supply path 62, the Ar gas supply path 63 and the N$_2$ gas supply path 64, respectively. Subsequently, the microwave generating device 102 oscillates microwaves of, e.g., 2.45 GHz. The oscillated microwaves are introduced to the remote plasma generating device 100 through the waveguide 101. Thus, each of the NH$_3$ gas, Ar gas and N$_2$ gas is converted to plasmas. These plasmas are introduced into the processing chamber 41 through the plasma introduction passage 103. Further, the temperature of the wafer W mounted on the mounting table 42 is controlled to a predetermined target temperature (e.g., about 35 degrees C.) by the temperature controller 55. The internal pressure of the processing chamber 41 is depressurized compared to an atmospheric pressure.

Thereafter, the HF gas is supplied to the processing chamber 41 through the HF gas supply path 61 and the gas supply nozzle 104. At this time, the HF gas is also converted to plasma by the plasmas of the NH$_3$ gas, Ar gas and N$_2$ gas which are previously introduced to the processing chamber 41. Thus, an internal atmosphere of the processing chamber 41 becomes a plasma process atmosphere defined by a mixture gas of the HF gas and the NH$_3$ gas. Plasmas obtained by the mixture gas are supplied onto a surface of the wafer W within the processing chamber 41.

Figure 4:
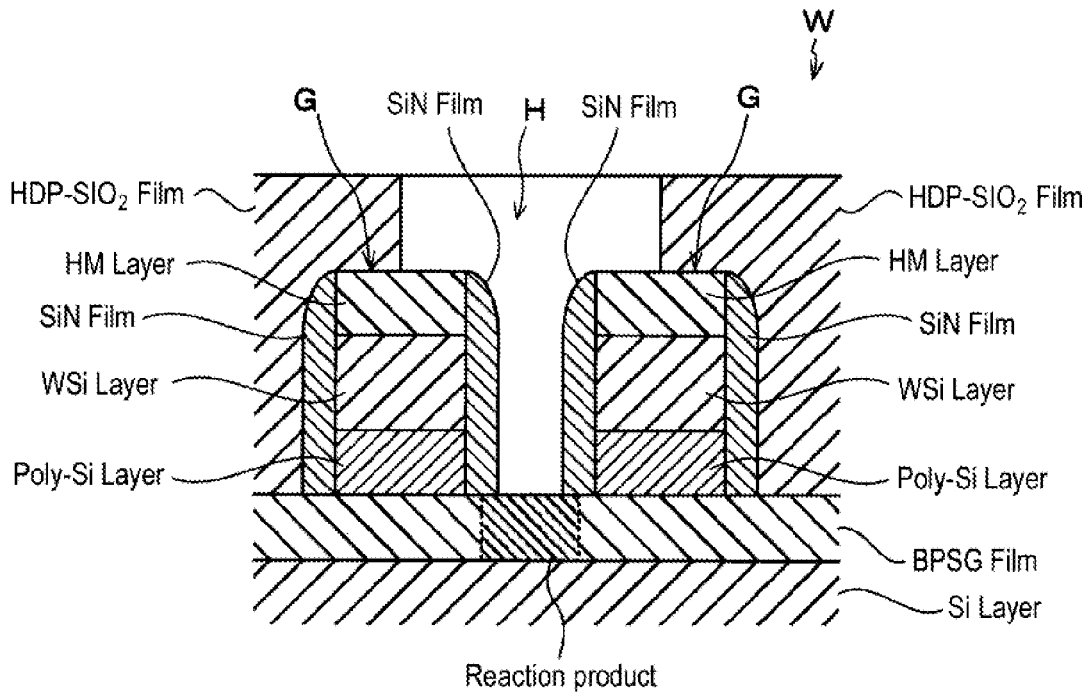
FIG. 4 is a schematic vertical sectional view showing a state of a wafer after a chemical oxide removal (COR) process.

Further, the BPSG film, which is exposed at the lower portion of the contact hole H formed in the surface of the wafer W, chemically reacts with the plasma of the HF gas and the plasma of the NH$_3$ gas so that the BPSG film is modified into a reaction product (see FIG. 4). Ammonium fluorosilicate (($NH_4$)$_2$SiF$_6$), moisture (H$_2$O) or the like may be produced as the reaction product. Such a chemical reaction is isotropically performed so that the reaction product is produced in a horizontal direction while vertically extending from the lower portion of the contact hole H to the upper surface of the Si layer.

Further, in the COR process, supply flow rates of processing gases, supply flow rates of the inert gases, an exhaust flow rate, and the like are adjusted such that the process atmosphere is maintained at a predetermined pressure (e.g., about 80 mTorr (about 10.7 Pa) lower than the atmospheric pressure. Further, a sublimation point of the ammonium fluorosilicate in the reaction product is about 100 degrees C. When the temperature of the wafer W is 100 degrees C. or higher, the reaction product may not be easily produced. Thus, in some embodiments, the temperature of the wafer W may be set to be lower than about 100 degrees C. Further, the chemical reaction may be accelerated by adjusting a temperature of the silicon oxide film depending on a type of a silicon oxide, or a ratio of the HF gas in the mixture gas. This controls a production amount of the reaction product. Accordingly, it is possible to control an etching rate after the PHT process (which will be described later).

However, in the COR process, the HDP-SiO$_2$ film formed on the BPSG film may chemically react with the plasmas of the mixture gas, which causes the modification of the HDP-SiO$_2$ film. Thus, in some embodiments, a ratio of the NH$_3$ gas in the mixture gas may be smaller than that of the HF gas to prevent the modification of the HDP-SiO$_2$ film. That is, the supply flow rate of the NH$_3$ gas may be smaller than that of the HF gas. Thus, the chemical reaction in the HDP-SiO$_2$ film may be prevented, while the chemical reaction in the BPSG film is being actively progressed.

After a layer of the reaction product is sufficiently formed by the chemical reaction as described above, the supply of the microwaves is stopped and the supply of the HF gas, the NH$_3$ gas and the Ar gas is also stopped. Also, the interior of the processing chamber 41 is forcibly exhausted for a predetermined period of time such that the HF gas and the NH$_3$ gas are forcibly exhausted from the processing chamber 41. In this way, the COR process is terminated. Subsequently, the PHT process starts.

The internal atmosphere of the processing chamber 41 in the PHT process is kept at an N$_2$ atmosphere due to the N$_2$ gas continuously supplied from the start of the COR process. An atmospheric pressure at this time is adjusted to a predetermined pressure (e.g., 500 Pa or higher) in which the plasma of the N$_2$ gas is not generated, in the remote plasma generating device 100 and the processing chamber 41 when the microwaves are supplied, which will be described later. Further, a temperature of the wafer W in the PHT process is adjusted to be equal to that of the wafer W in the COR process.

Subsequently, the microwaves are supplied to the remote plasma generating device 100. In some embodiments, the power of the microwaves may be range from 100 to 1000 W. As described above, since the remote plasma generating device 100 is under the conditions in which plasma is not generated, the microwaves supplied to the remote plasma generating device 100, without generating the plasma of the $N_2$ gas, are introduced to the processing chamber 41 through the plasma introduction passage 103.

The microwaves introduced to the processing chamber 41 are radiated onto the reaction product produced by the COR process. In this case, the microwaves are also radiated onto the moisture ($H_2O$) which is part of the reaction product. The moisture has a property that is easy to be heated by the microwaves. As such, upon the radiation of the microwaves to the reaction product, the temperature of the moisture in the reaction product is increased in a short period of time. That is, a temperature of the entire reaction product is also increased. On the other hand, since the silicon wafer W has a property that is hard to be heated by the microwaves, although the wafer W is radiated with the introduced microwaves, the temperature of the wafer W is not increased. That is, in the PHT process, only the reaction product sublimates while being selectively heated. This makes it possible to remove the reaction product from the BPSG film without increasing the temperature of the wafer W.

After the reaction product produced in the COR process is sufficiently removed, the PHT process is terminated.

The COR process and the PHT processes as described above are repeatedly performed until the desired etching rate is obtained. At this case, in a case where the COR process is performed again after the PHT process, since the wafer W has not been heated during the PHT process, the temperature of the wafer W is adapted for the COR process. This makes it possible to directly start the COR process without waiting a long period of time for adjusting the temperature of the wafer W prior to the COR process.

Figure 5:
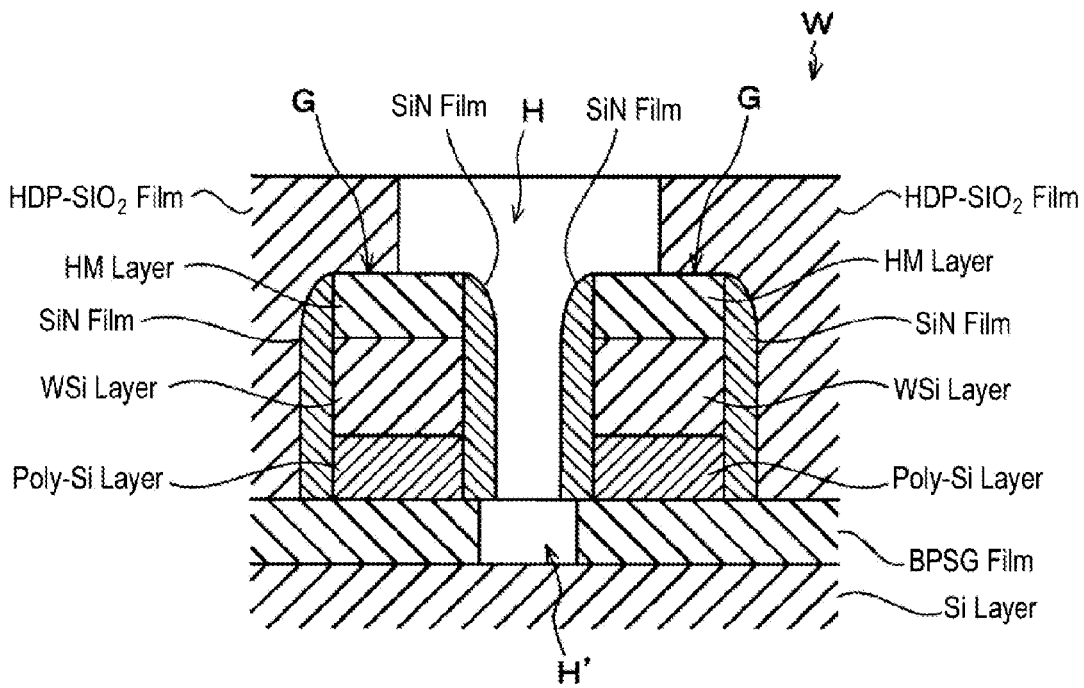
FIG. 5 is a schematic vertical sectional view showing a state of the wafer after a post heat treatment (PHT) process.

By repeatedly performing the COR process and the PHT process until the reaction product is etched at the desired etching rate, as shown in FIG. 5, a space H' communicating with the lower portion of the contact hole H is formed above the Si layer so that a new surface of the BPSG film is exposed.

Thereafter, the interior of the processing chamber 41 is forcibly exhausted and depressurized by the exhaust mechanism 44. Upon completion of the forcible exhaust, the gate valve 54 is opened and the wafer W is taken out the processing chamber 41 by the second wafer transfer mechanism 17. Then, the wafer W is transferred to the load lock chamber 3 through the inlet/outlet 53.

Subsequently, the gate valve 54 is closed, and the load lock chamber 3 and the transfer chamber 12 communicate with each other. Thereafter, the wafer W is taken out the load lock chamber 3 by the first wafer transfer mechanism 11 and is loaded to the respective carrier 13*a* mounted on the mounting table 13. In this manner, the etching process in the processing system 1 is terminated.

With the etching method according to this embodiment, the COR process and the PHT process are performed using the same chamber, which makes it possible to omit transferring the wafer between the modification chamber (for the COR process) and the heating chamber (for the PHT process) which are required in the related art. Further, according to the etching method, the reaction product is heated without increasing the temperature of the wafer W during the PHT process, which makes it possible to shorten the time required for adjusting the temperature of the wafer W when performing the COR process again after the PHT process. This results in an increase in throughput.

In addition, in the PHT process, the microwaves used to generate the plasma in the COR process are employed as is. This eliminates the need for installing a new heating source for the PHT process, thus reducing the manufacturing cost of the etching apparatus.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures.

For example, the types of the processing gases supplied in the COR process are not limited to those mentioned in the above embodiments. In some embodiments, instead of the HF gas, any one of an $F_2$ gas, an $NF_3$ gas, a $CH_3F$, an $SF_6$ gas and a $ClF_3$ gas may be used, or a mixture of two or more types of the gases may be used. As an example, a mixture gas of a halogen element-containing gas and a basicity gas may be used as the processing gas supplied in the COR process.

Further, the type of the inert gas is not limited to the above embodiments. In some embodiments, any one of a helium (He) gas and a xenon (Xe) gas may be used. Alternatively, among the Ar gas, the $N_2$ gas, the He gas and the Xe gas, a mixture gas of two or more gases may be used. In some embodiments, a gas having a property that is hard to generate plasma may be used as the inert gas supplied in the PHT process.

While in the above embodiment, the silicon wafer W as the semiconductor wafer has been described as the substrate with the silicon oxide film formed thereon, the present disclosure is not limited thereto. In some embodiments, various types of substrates such as an LCD glass substrate, a CD substrate, a print substrate, and a ceramic substrate may be used.

Further, the structure of the substrate to be processed in the processing system 1 is not limited to that described in the above embodiments. Furthermore, while in the above embodiments, the etching process in the processing system 1 has been described to be performed in the lower portion of the contact hole H before forming a capacitor C, the present disclosure is not limited thereto. In some embodiments, the etching process may be performed in various portions.

Further, while in the above embodiments, the BPSG film as the silicon oxide film has been described as a target to be etched in the processing system 1, the present disclosure is not limited thereto. Alternatively, other silicon oxide films such as the HDP-$SiO_2$ film may be used as the etching target.

Further, the type of CVD method used in forming the CVD-based oxide film on the substrate is not particularly limited. As an example, a thermal CVD method, a normal pressure CVD method, a low pressure CVD method, a plasma CVD method or the like may be used. Furthermore, the present disclosure may be applied in etching a silicon oxide other than the CVD-based oxide film, for example, a native oxide film, a chemical oxide film that is generated by a chemical liquid in a resist removing process, a thermal oxide film formed by a thermal oxidation, or the like.

Moreover, while in the above embodiments, the etching apparatus 5 has been described to be configured such that the remote plasma is generated using the microwaves in the COR process, the etching apparatus 5 may be configured such that the plasma is generated inside the processing chamber 41. Further, the method of generating the plasma is not limited to that using the microwaves. In some embodiments, the microwave generating device 102 may be installed for the PHT process and a separate high frequency power device may be installed to generate plasma in the COR process. In this configuration, the plasma may be generated by the known plasma generating method. In this case, as in the above embodiments, the microwaves (for generating plasma) used in the COR process are used in the PHT process as is so that the etching apparatus 5 may be simplified. Further, plasma generation conditions such as a pressure of the chamber 40, an internal temperature of the chamber 40, power of microwaves or the like, may be appropriately modified according to a plasma generating method or a configuration of the etching apparatus 5. That is, conditions under which the plasma is generated in the COR process but is not generated in the PHT process may be required to provide the same effects as the above embodiments.

Figure 6:
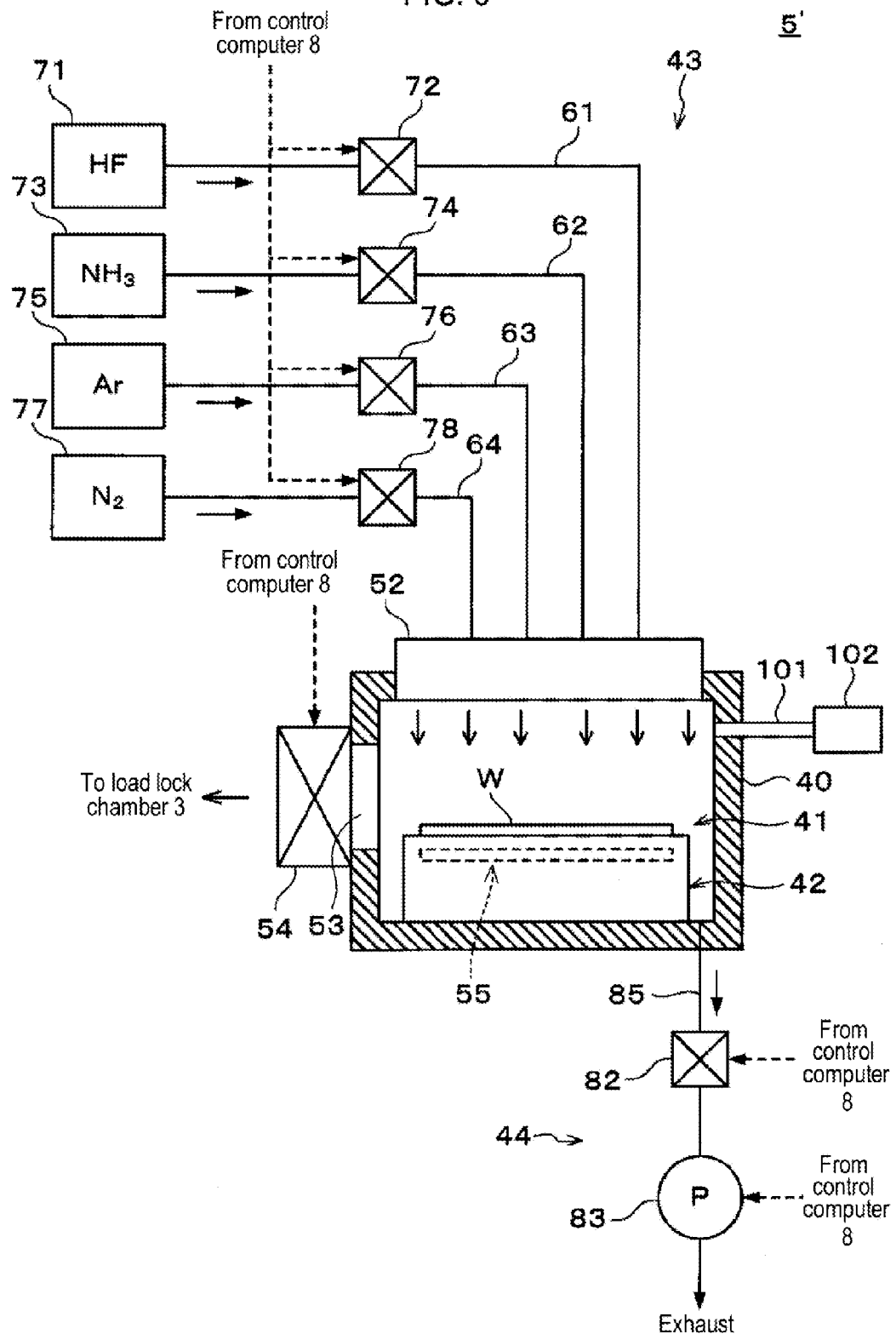
FIG. 6 is a schematic view showing a configuration of an etching apparatus according to another embodiment of the present disclosure.

In some embodiments, the plasma may not be generated in the COR process. In this case, as shown in FIG. 6, an etching apparatus 5' according to another embodiment may be configured to include a shower head 52 installed in the ceiling of the chamber 40. The shower head 52 has a plurality of discharge holes (not shown) through which gas is discharged as indicated by arrows. In the etching apparatus 5' as shown in FIG. 6, the HF gas supply path 61, the $NH_3$ gas supply path 62, the Ar gas supply path 63 and the $N_2$ gas supply path 64 are connected to the shower head 52. Further, in the etching apparatus 5', the waveguide 101 connected to the microwave generating device 102 may be connected to a side wall of the chamber 40 such that the microwaves are introduced to the processing chamber 41.

In the COR process using the etching apparatus 5' configured as above, for example, a mixture gas of the HF gas and the $NH_3$ gas is directly introduced to the processing chamber 41 through the shower head 52 to generate a reaction product. At this time, the microwaves are not supplied. Thereafter, in the subsequent PHT process, the microwaves are introduced to the processing chamber 41 to heat and remove the reaction product. This makes it possible to heat the reaction product without increasing the temperature of the wafer W in the PHT process.

As described above, the microwaves may be used to heat the reaction product as long as an equipment configured to introduce the microwaves into the chamber 40 in the PHT process is provided, regardless of a mode of the chemical oxide removal operation in the COR process. With this configuration, it is possible to heat the reaction product without increasing the temperature of the wafer W in the PHT process, thus providing the same effects as the above embodiments.

While in the above embodiments, the microwaves has been described to be used to heat the reaction product in the PHT process, the heating of the reaction product is not limited to the radiation of the microwaves. Alternatively, other heating unit may be used as long as it can selectively heat the reaction product. The following is a description of an example of another heating unit.

<Radiation of Infrared Light>

As an example, an infrared light (infrared ray) of a predetermined wavelength may be radiated onto the reaction product to selectively heat the reaction product. Silicon is predisposed to transmit the infrared light of the predetermined wavelength at a temperature of about 300 degrees C. As such, the silicon wafer W is predisposed to transmit the infrared light at a temperature (equal to that in the COR process in the above embodiment) in the PHT process. On the other hand, the ammonium fluorosilicate as the reaction product is predisposed to absorb the infrared light. Specifically, once the infrared light is radiated onto the reaction production, the silicon wafer W is not heated but the reaction product is selectively heated. However, in a case where a wavelength of the infrared light is too long, the infrared light is absorbed to the silicon. That is, the "predetermined wavelength" refers to a wavelength over which the infrared light can transmit through the substrate with the reaction production produced therein.

Figure 7:
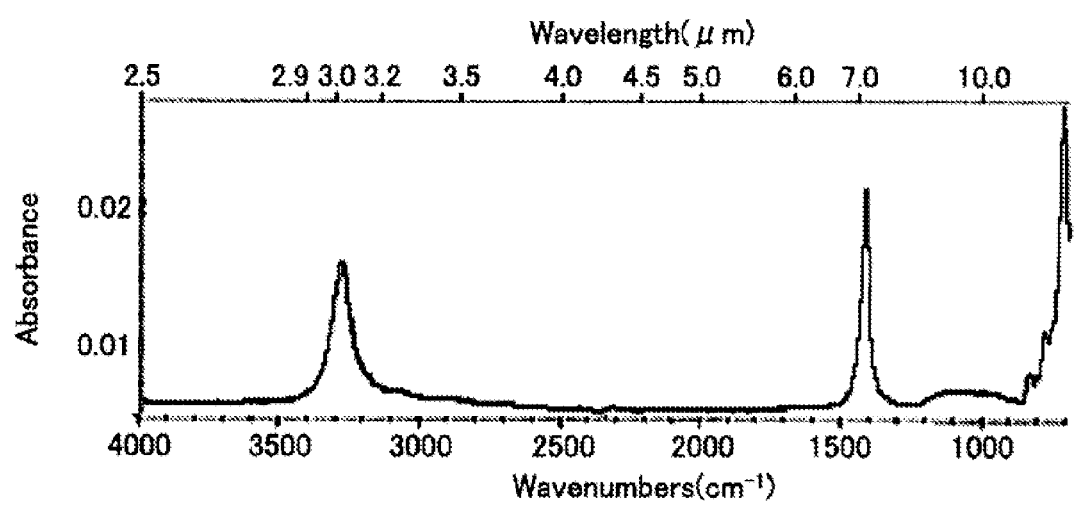
FIG. 7 is a view showing an infrared absorption spectrum of ammonium fluorosilicate.

FIG. 7 shows an infrared ray absorption spectrum of the ammonium fluorosilicate produced as the reaction product, which was measured by the inventors of the present disclosure. As shown in FIG. 7, some peaks of absorbance of the ammonium fluorosilicate were manifested. In some embodiments, a wavelength having the range of from 2.5 to 4.0 μm, within which a first peak is presented, may be selected as a wavelength of the infrared light that transmits through the silicon wafer W and is absorbed by the ammonium fluorosilicate. In some embodiments, a wavelength of the infrared light having the range of from 2.9 to 3.2 μm, within which the absorbance of the ammonium fluorosilicate becomes higher, may be used.

Figure 8:
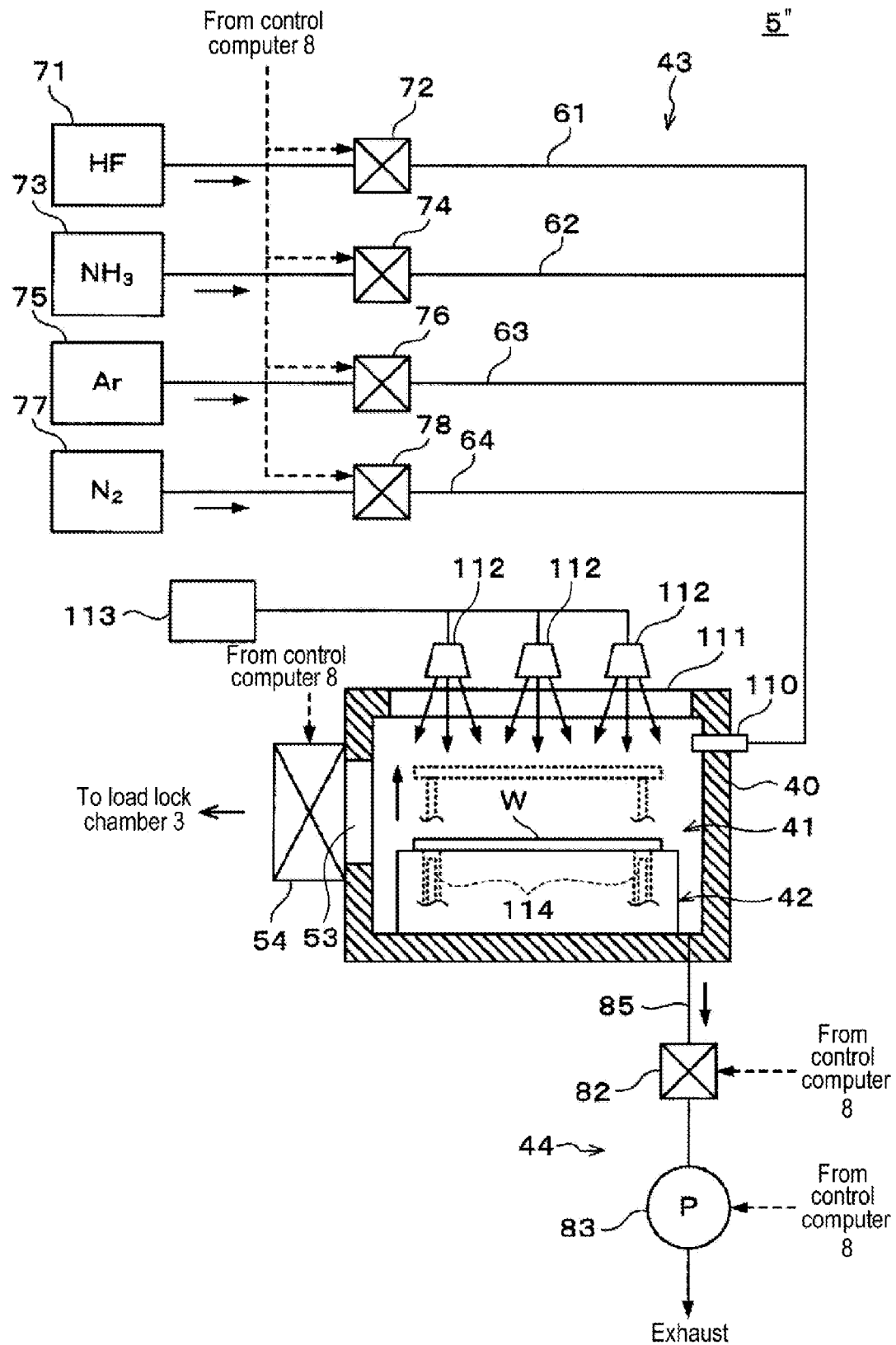
FIG. 8 is a schematic view showing a configuration of an etching apparatus according to another embodiment of the present disclosure.

Next, a configuration of an etching apparatus 5" according to another embodiment in which the infrared light is radiated onto the reaction production will be described. As shown in FIG. 8, in the etching apparatus 5", a mixture gas supply nozzle 110 is installed in a side wall of the chamber 40. The HF gas supply path 61, the $NH_3$ gas supply path 62, the Ar gas supply path 63 and the $N_2$ gas supply path 64 are connected to the mixture gas supply nozzle 110. A transmission window 111 through which the infrared light is transmitted is provided in the ceiling of the chamber 40. A plurality of infrared halogen lamps 112 as infrared light generating sources is arranged above the chamber 40. Each of the infrared halogen lamps 112 is connected to a power source 113. Further, lift pins 114 for supporting a lower surface of the wafer W are installed inside the mounting table 42. The lift pins 114 are configured to be movable in a vertical direction. That is, the vertical movement of the lift pins 114 allows the wafer W to be lifted or lowered. In FIG. 8, the temperature controller 55 is not shown.

In the etching apparatus 5" configured as above, a mixture gas of an HF gas and an $NH_3$ gas is introduced from the mixture gas supply nozzle 110 to the processing chamber 41 in the COR process so that a reaction product is produced. In a subsequent PHT process, the lift pins 114 are raised such that the wafer W approaches the transmission window 111. Thereafter, the infrared halogen lamps 112 are operated to radiate the infrared light onto the wafer W.

Then, the infrared light is absorbed to the reaction product so that a temperature of the reaction product is increased, thereby sublimating the reaction product. In this case, since the infrared light transmits through the wafer W, the temperature of the wafer W is not increased. That is, it is possible to remove the reaction product without increasing the temperature of the wafer W. Further, according to this embodiment, since the wafer W is lifted near the light sources, the reaction product is easy to be heated compared to a state where the wafer W is mounted on the mounting table 42.

While in the above embodiment, the infrared halogen lamps 112 has been described to be used as the light sources configured to generate the infrared light, the present disclosure is not limited thereto. In some embodiments, an infrared lamp, an infrared LED or an infrared laser may be used. Further, the number of the light sources is not particularly limited but may be appropriately modified depending on radiation ranges of the respective light sources, a size of the wafer W and the like. Furthermore, in the above embodiment, the light sources has been described to be installed above the chamber 40 but may be installed at any positions as long as they can radiate the infrared light to the reaction product. Further, a mechanism configured to lift up the wafer W is not limited to one using the lift pins 114.

Figure 9:
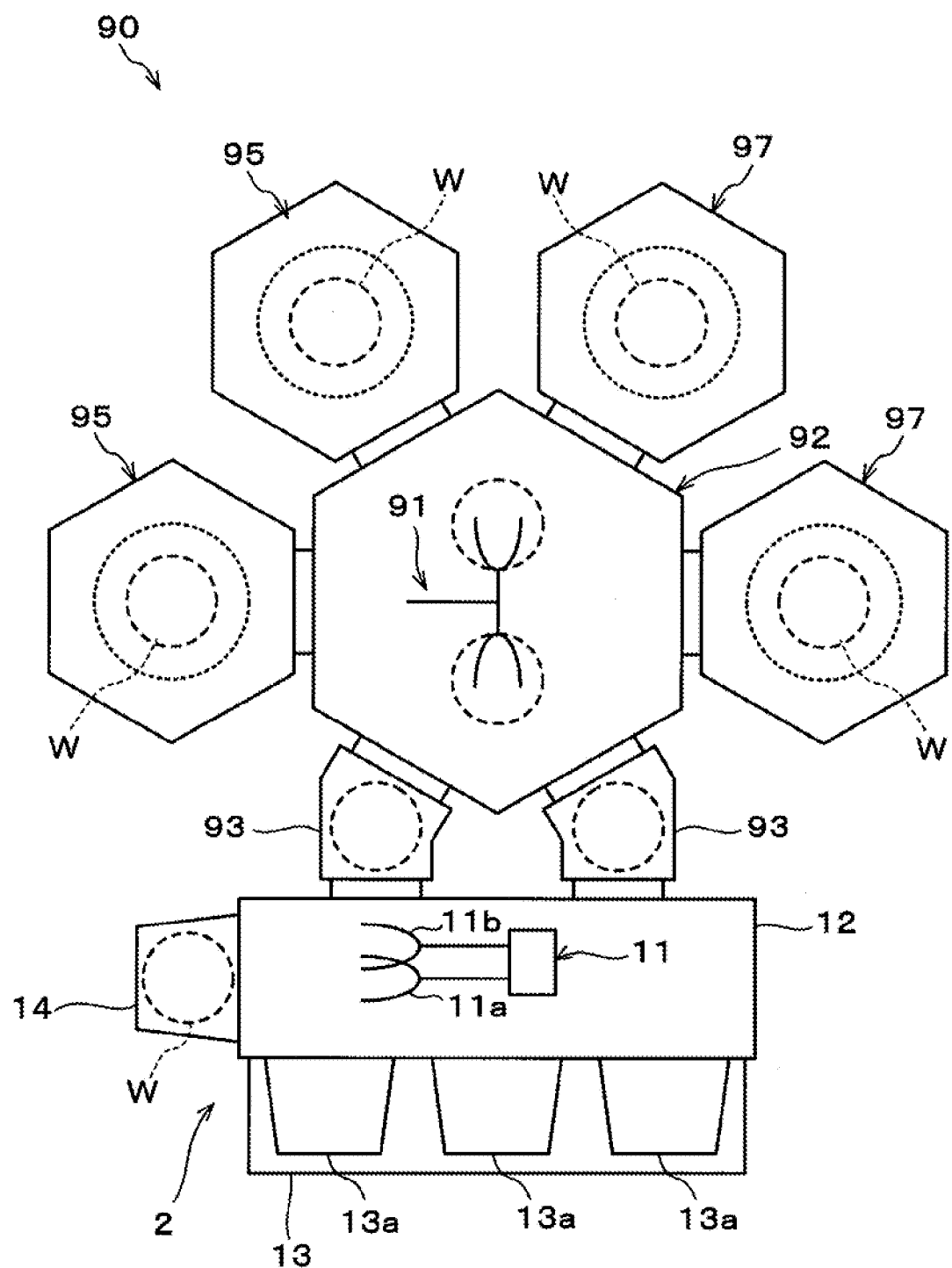
FIG. 9 is a schematic plane view of a processing system according to another embodiment of the present disclosure.

Further, the structure of the processing system 1 is not limited to that shown in the above embodiment. In some embodiments, the processing system 1 may be a processing system including a film forming apparatus in addition to the aforementioned etching apparatuses. As an example, as shown in FIG. 9, a processing system 90 may include a common transfer chamber 92 in which a wafer transfer mechanism 91 is installed. The common transfer chamber 92 is connected to the transfer chamber 12 through load lock chambers 93 interposed between the common transfer chamber 92 and the transfer chamber 12. Further, the common transfer chamber 92 is coupled to etching apparatuses 95, and film forming apparatuses 97 such as CVD apparatuses. In the processing system 90 configured as above, the wafer W can be transferred between the load lock chambers 93, the etching apparatuses 95, and the film forming apparatuses 97 by the wafer transfer mechanism 91. The interior of the common transfer chamber 92 is configured to be vacuum-drawn. Specifically, the common transfer chamber 92 is vacuum-drawn such that the wafer W taken out the etching apparatus 95 by the wafer transfer mechanism 91 is transferred to the film forming apparatus 97 without bringing the wafer W into contact with oxygen in the atmosphere. This prevents a native oxide film from being attached onto the wafer W which has undergone the PHT process, thereby properly performing a formation of a film (e.g., the capacitor C).

According to the present disclosure in some embodiments, a modification process and a heating process are performed using the same chamber, which makes it possible to omit the step of transferring a wafer between a modification chamber and a heating chamber, which is required in the related art. In addition, according to the present disclosure, a reaction product is heated without increasing a temperature of a substrate in the heating process, thereby reducing a time required for adjusting the temperature of the substrate when performing the modification process again after the heating process. Accordingly, it is possible to enhance throughput.

The present disclosure can be applied in etching a silicon oxide formed on a surface of a silicon wafer.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A method of etching a silicon oxide film formed on a substrate, comprising:
   supplying a mixture gas of a halogen element-containing gas and a basicity gas onto a surface of the silicon oxide film;
   modifying the silicon oxide film to produce a reaction product; and
   after producing the reaction product, heating the reaction product to remove the reaction product,
   wherein modifying the silicon oxide film and heating the reaction product are performed using one chamber, and
   wherein in heating the reaction product, the reaction product is selectively heated by a heating unit without heating the substrate.

2. The method of claim 1, wherein the heating unit is configured to radiate microwaves to the reaction product.

3. The method of claim 2, wherein modifying the silicon oxide film includes generating plasma by converting the mixture gas using the microwaves.

4. The method of claim 3, wherein the plasma is a remote plasma.

5. The method of claim 1, wherein the heating unit is configured to radiate an infrared light having a predetermined wavelength to the reaction product.

6. The method of claim 5, wherein the predetermined wavelength of the infrared light ranges from 2.5 to 4.0 μm.

7. The method of claim 5, wherein heating the reaction product includes arranging a substrate on which the silicon oxide film is formed to approach a light source configured to generate the infrared light.

8. The method of claim 1, wherein the halogen element-containing gas is at least one selected from a group consisting of an HF gas, an $F_2$ gas, an $NF_3$ gas, a $CH_3F$ gas, an $SF_6$ gas and a $ClF_3$ gas, and the basicity gas includes an $NF_3$ gas.

9. The method of claim 1, further comprising, after producing the reaction product, stopping the supply of the mixture gas and exhausting the mixture gas from the surface of the silicon oxide film before heating the reaction product.

* * * * *